US008601205B1

(12) United States Patent
Menon et al.

(10) Patent No.: US 8,601,205 B1
(45) Date of Patent: Dec. 3, 2013

(54) DYNAMIC RANDOM ACCESS MEMORY CONTROLLER

(75) Inventors: Raghavan Menon, Saratoga, CA (US); Raj Mahajan, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 931 days.

(21) Appl. No.: 12/346,859

(22) Filed: Dec. 31, 2008

Related U.S. Application Data

(60) Provisional application No. 61/018,344, filed on Dec. 31, 2008.

(51) Int. Cl.
*G06F 12/00* (2006.01)

(52) U.S. Cl.
USPC .................... 711/105; 711/108; 711/E12.017

(58) Field of Classification Search
None
See application file for complete search history.

(56) References Cited

U.S. PATENT DOCUMENTS

| | | | | |
|---|---|---|---|---|
| 5,404,482 | A * | 4/1995 | Stamm et al. | 711/145 |
| 5,463,759 | A * | 10/1995 | Ghosh et al. | 711/134 |
| 5,966,727 | A | 10/1999 | Nishino | |
| 6,052,134 | A * | 4/2000 | Foster | 345/533 |
| 6,389,514 | B1 * | 5/2002 | Rokicki | 711/136 |
| 6,421,758 | B1 * | 7/2002 | Buti | 711/108 |
| 6,591,349 | B1 * | 7/2003 | Steinman et al. | 711/154 |
| 6,631,440 | B2 * | 10/2003 | Jenne et al. | 711/105 |
| 6,662,265 | B1 * | 12/2003 | Kessler et al. | 711/105 |
| 6,711,083 | B2 | 3/2004 | Demone | |
| 6,732,227 | B1 * | 5/2004 | Baumann | 711/108 |
| 6,820,170 | B1 * | 11/2004 | Elnathan et al. | 711/108 |
| 6,934,795 | B2 * | 8/2005 | Nataraj et al. | 711/108 |
| 6,963,516 | B2 | 11/2005 | Blackmon et al. | |
| 7,143,231 | B1 * | 11/2006 | Srinivasan et al. | 711/108 |
| 7,149,857 | B2 * | 12/2006 | Jeddeloh | 711/158 |
| 7,152,150 | B2 * | 12/2006 | Sato et al. | 711/168 |
| 7,167,946 | B2 * | 1/2007 | Osborne | 711/105 |
| 7,194,627 | B2 | 3/2007 | Cheung et al. | |
| 2003/0070016 | A1 * | 4/2003 | Jones et al. | 710/107 |
| 2003/0163649 | A1 * | 8/2003 | Kapur et al. | 711/146 |

* cited by examiner

*Primary Examiner* — Edward Dudek, Jr.
*Assistant Examiner* — Christopher Birkhimer
(74) *Attorney, Agent, or Firm* — Baker Botts L.L.P.

(57) ABSTRACT

A Dynamic Random Access Memory (DRAM) controller. The DRAM controller includes receiving a plurality of access requests from a plurality of user interfaces to access one or more DRAM devices. Further, the DRAM controller includes storing the plurality of access requests in a Content Addressable Memory (CAM). Furthermore, the DRAM controller includes updating at least one access request of the plurality of access requests to a Next Access Table. In addition, the DRAM controller includes determining at least one paramount access request of the plurality of access requests by a CAM based decision controller for employing a bypass operation in the CAM based decision controller, based on a plurality of pre-defined conditions. Further, the DRAM controller includes issuing the plurality of access requests to the one or more DRAM devices.

20 Claims, 7 Drawing Sheets

DYNAMIC RANDOM ACCESS MEMORY CONTROLLER

CROSS REFERENCE TO RELATED APPLICATIONS

This patent application claims priority from provisional patent application number "61/018,344" titled "Memory Controller for Memory Devices", filed on Dec. 31, 2007 in the United States Patent and Trademark Office.

BACKGROUND

In modern electronic systems, high-speed Dynamic Random Access Memory (DRAM) devices are key components in just about every design. The DRAM devices are simple in structure but require a more complicated interface than other memory technologies like Static Random Access Memories (SRAM's). Currently, the DRAM devices require several advanced features that are required to achieve the performance levels required by modern processing devices. This requires additional circuitry on the Memory Controller and makes it more difficult for a designer to create a controller from scratch.

Often, Memory Controller implementations have attempted to improve DRAM access efficiency by taking a stream of access requests and optimizing these requests to make sure that no access requests to memory are wasted. Currently, the memory controller implements only a few optimizations due to limited length of the access stream. This limitation is due to the use of a traditional state machine to make access priority decisions since a traditional state machine becomes unmanageably complex as multiple accesses are added to the decision mechanism. If a larger section of the access stream could be used for optimization then access efficiency would go up substantially and the system bandwidth would increase, cost would go down and power consumption would be reduced.

Additionally, previous implementation of memory controller has required most operations to go through the scheduling and re-ordering paths inside the controller. This results in a higher minimum latency through the memory controller.

In light of the foregoing discussion there is a need for an efficient Dynamic Random Access Memory (DRAM) controller.

SUMMARY

Embodiments of the invention described herein provide a method, system and computer program product for reducing latency in a Dynamic Random Access Memory controller.

An example method for reducing latency in a Dynamic Random Access Memory (DRAM) controller includes receiving a plurality of access requests from a plurality of user interfaces to access one or more DRAM devices. Further, the method includes storing the plurality of access requests in a Content Addressable Memory (CAM). Furthermore, the method includes updating at least one access request of the plurality of access requests to a Next Access Table. In addition, the method includes determining at least one paramount access request of the plurality of access requests by a CAM based decision controller for employing a bypass operation in the CAM based decision controller, based on a plurality of pre-defined conditions. Further, the method includes issuing the plurality of access requests to the one or more DRAM devices.

An example system includes a Dynamic Random Access Memory (DRAM) controller associated with a plurality of user interfaces and a plurality of DRAM devices. Further, the system includes a Content Addressable Memory (CAM) based decision control module associated the DRAM controller. Furthermore, the system includes a DRAM access control interface associated with the CAM based decision control module. In addition, the system includes a decision logic module with added bypass evaluation logic associated with the CAM based decision control module. Further, the system includes a CAM access storage module in association with the decision logic module with added bypass evaluation logic. Furthermore, the system includes a Next Access Table module in association with the decision logic module with added bypass evaluation logic.

An example computer program product for reducing latency in Dynamic Random Access Memory (DRAM) controller is provided. The computer program product includes a computer readable program code. The computer readable program code receives a plurality of access requests from a plurality of user interface to access one or more Dynamic Random Access Memory (DRAM) devices. Further, the computer readable program code stores the plurality of access requests in a Content Addressable Memory (CAM). Furthermore, the computer readable program code updates at least one access request of the plurality of access requests to a Next Access Table. In addition, the computer readable program code determines at least one paramount access request of the plurality of access requests by a CAM based decision controller for employing bypass operations in the Content Addressable Memory (CAM) based decision controller, based on a plurality of pre-defined conditions. Further, the computer readable program code issues the plurality of access requests the Dynamic Random Access Memory (DRAM) devices.

DETAILED DESCRIPTION OF THE EMBODIMENTS

Embodiments of the invention provide a method, system and computer program product for reducing latency in a Dynamic Random Access Memory (DRAM) controller. The present disclosure covers the capability of allowing incoming Memory operations or Memory operations implied by the incoming command to Bypass the scheduling and storage sections inside the Controller to minimize latency.

Further, the present disclosure also describes the use of Content Addressable Memory (CAM) based architecture to store accesses and the use of non-traditional decision logic to identify optimization opportunities resulting in significant efficiency improvements for reducing latency in a Dynamic Random Access Memory (DRAM) controller. In particular, Bypass operations are handled using the CAM-based architecture and one or more functional algorithms.

Figure 1:
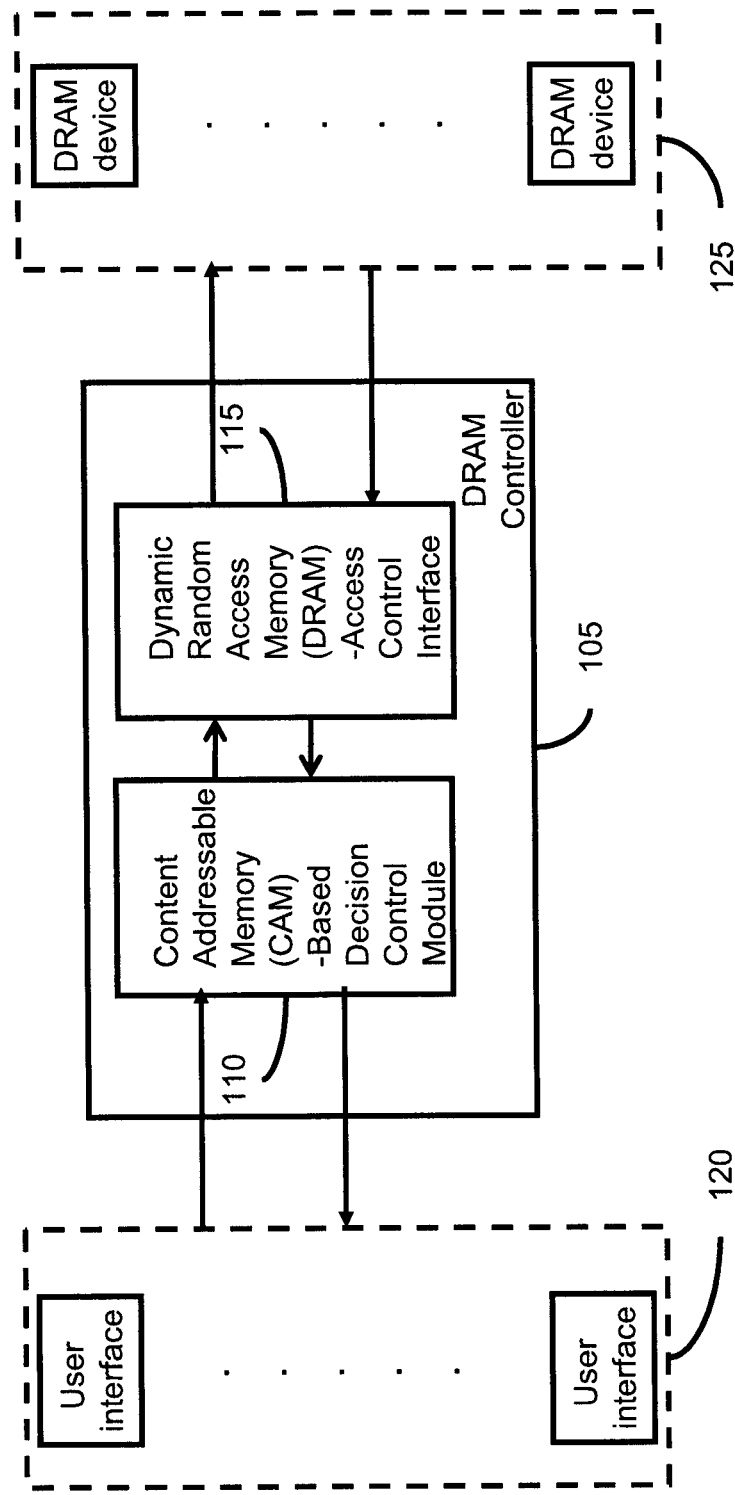
FIG. 1 is a block diagram of a Dynamic Random Access Memory controller in accordance with an embodiment of the invention.

FIG. 1 is a block diagram of a Dynamic Random Access Memory controller 105 in accordance with an embodiment of the invention. The system includes a DRAM controller 105. Examples, of the DRAM include, but are not limited to, video Dynamic Random Access Memory (VRAM), Fast Page Mode Dynamic Random Access Memory (FPM DRAM) or FPDRAM, Extended Data Out Dynamic Random Access Memory (EDO DRAM), Synchronous Dynamic Random Access Memory (SDRAM), Double Data Rate Synchronous Dynamic Random Access Memory (DDR SDRAM), Low Power Double Data Rate Synchronous Dynamic Random Access Memory (LPDDR SDRAM), Double-Data-Rate two Synchronous Dynamic Random Access Memory (DDR2 SDRAM), Double-Data-Rate three Synchronous Dynamic Random Access Memory (DDR3 SDRAM). The DRAM controller 105 includes a Content Addressable Memory (CAM)-based decision control module 110, and a DRAM access control interface 115. Further, the DRAM controller 105 is in communication with one or more user interfaces 120 and one or more DRAM devices 125.

The user makes access requests from the DRAM Controller 105 and the DRAM Controller 105 issues access commands to the DRAM devices 125. The CAM-Based Decision Control module 110 optimizes the access stream and issues specific accesses to the DRAM Access Control Interface 115 which creates the specific signals and timing to control the read and write process to the DRAM devices 125.

Figure 2:
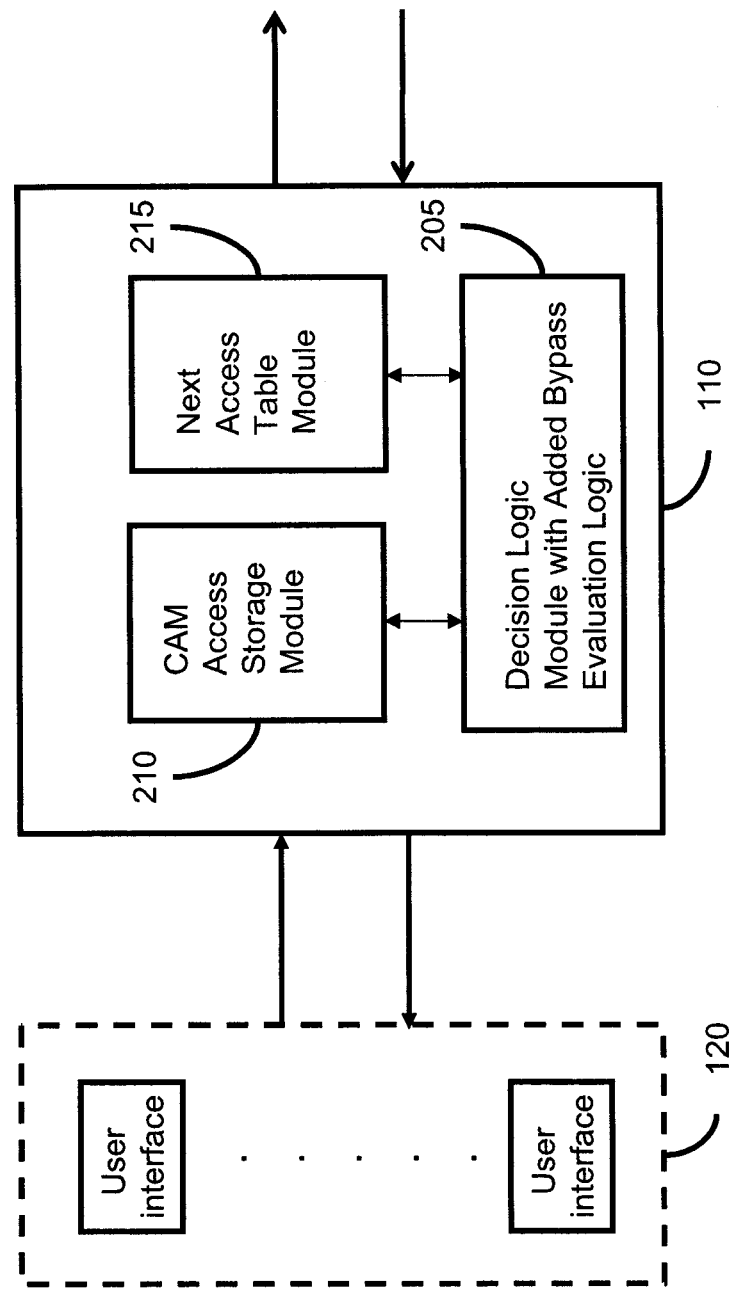
FIG. 2 is a block diagram of the Content Addressable Memory-based decision control module in accordance with an embodiment of the invention.

FIG. 2 is a block diagram of the CAM-Based Decision Control module 110 in accordance with another embodiment of the invention. The system is an exploded view of the CAM-based decision control module 110. Further, the CAM-based decision control module 110 includes a decision logic module with added bypass evaluation logic 205 in communication with a CAM access storage module 210 and a Next Access Table module 215. The CAM-based decision control module 110 performs multiple functions using the Decision Logic module 205, the Next Access Table module 215 and the CAM Access Storage module 210. The Decision Logic module 205 implements one or more pre-defined conditions. Examples of the one or more pre-defined conditions include, but are not limited to one or more algorithms. The pre-defined conditions determine at least one paramount access request of the plurality of access requests. The Decision Logic module 205 uses results from the CAM Access Storage module 210 and the Next Table module 215 to make the determination and includes a host of considerations like the age of the accesses in the CAM Access Storage, the order of the accesses, the number of accesses to the open bank and the priority of the access.

The CAM Access Storage module 210 stores each access requested of the DRAM controller 105 for the DRAM sub-system. The Next Access Table 215 is constantly updated when a new access request comes in by comparing the new request to the access requests in the CAM access storage module 210. The Decision Logic module 205 implements the pre-defined conditions or the one or more algorithms for determining the paramount or "best" access from the current Next Table entry, and the results of comparisons with the CAM access storage.

Figure 3:
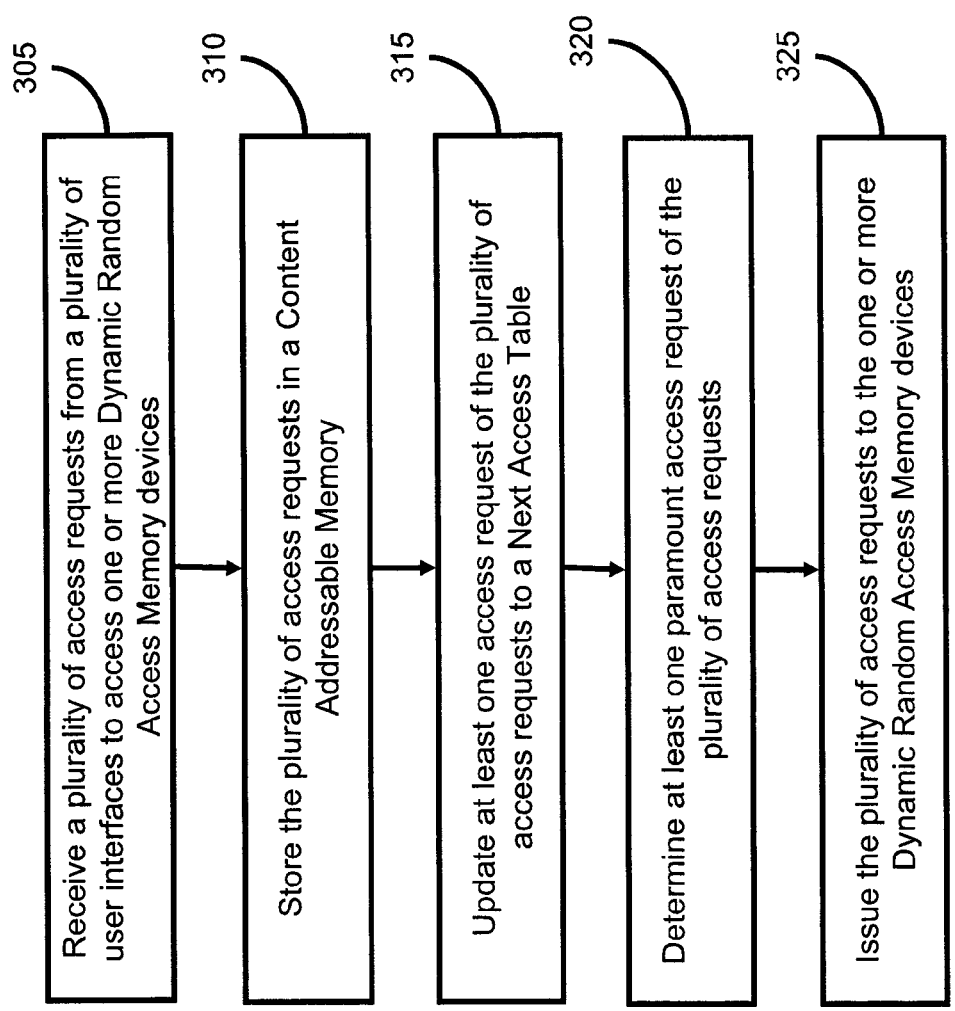
FIG. 3 is a flow chart illustrating a method for reducing latency in a Dynamic Random Access Memory (DRAM) controller, in accordance with an embodiment of the invention.

FIG. 3 is a flow chart illustrating a method for reducing latency in a Dynamic Random Access Memory (DRAM) controller, in accordance with an embodiment of the invention.

At step 305, a plurality of access requests is received from a plurality of user interfaces to access one or more DRAM devices. Examples of the plurality of access requests includes, but are not limited to, one or more memory operations or one or more memory commands. Examples of the commands in a DDR3 SDRAM device include but are not limited to Mode Register Set, Refresh, Self Refresh Entry, Self Refresh Exit, Single Bank Precharge, Precharge all Banks, Bank Activate, Write, Write with Auto Precharge, Read, Read with Auto Precharge, No Operation, Device Deselected, Power Down Entry, Power Down Exit, ZQ Calibration Long and ZQ Calibration Short.

In one embodiment the commands may change for other DRAM devices. Generally, these changes are limited to varying low-power states or an absence of ZQ calibration. In some embodiments, multiple DRAM devices with varying command sets may be supported by that embodiment.

At step 310, the plurality of access requests is stored in a Content Addressable Memory (CAM) access storage module. Further, the CAM access storage module stores each of the plurality of access requests of the controller for the DRAM sub-system. The sub-system in DRAM includes but is not limited to DRAM controller, PHY, off-chip DRAM devices, and any interconnect between these components.

At step 315, the at least one access request of the plurality of access requests is updated to a Next Access Table. The next access table compares at least one new access request of the plurality of access requests stored in the CAM access storage module.

At step 320, the at least one paramount or "best" access request of the plurality of access requests is determined by a decision logic based on a pre-defined conditions. Further, the pre-defined conditions include one or more algorithms to determine the paramount or the "best" access request from the Next Access Table entry and the results of comparisons from the CAM access storage.

Figure 5A:
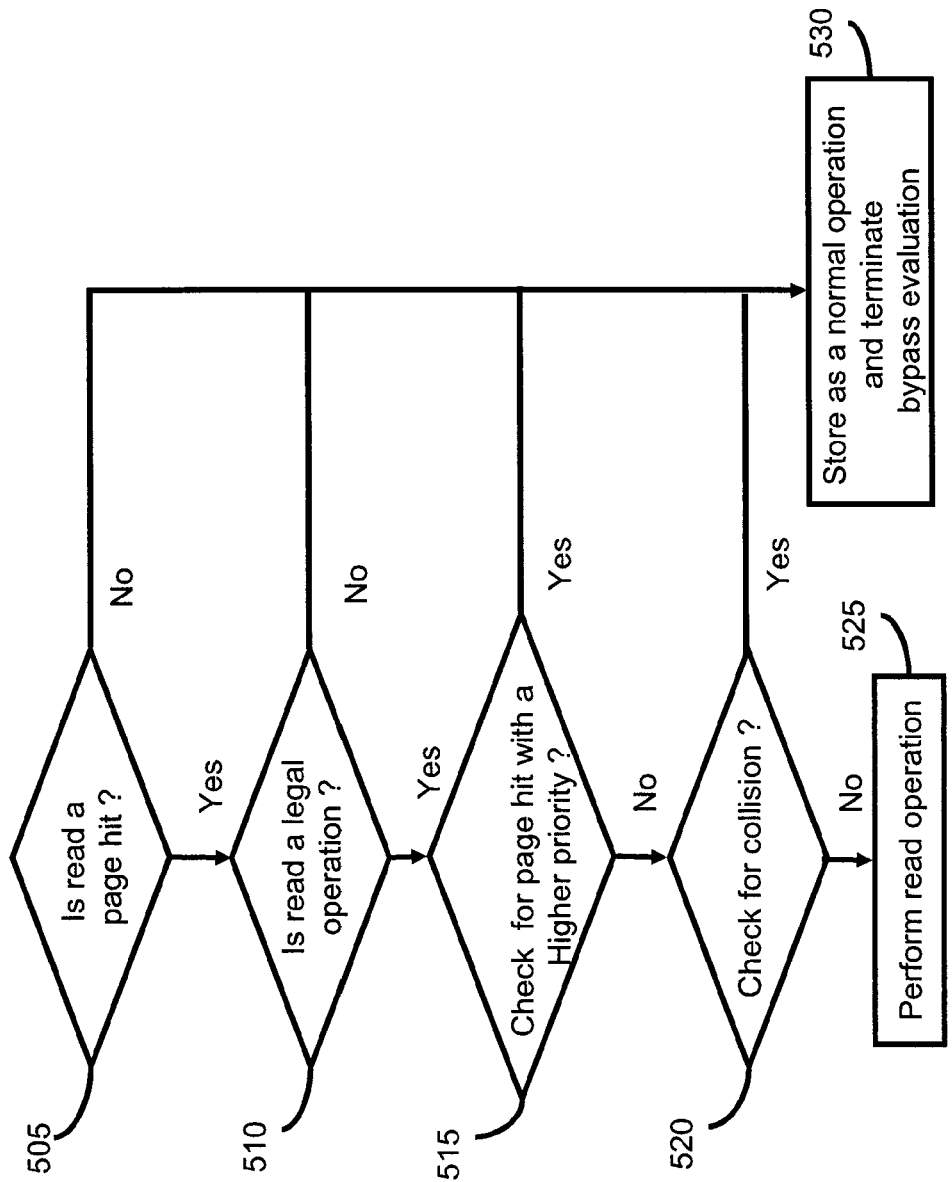
FIG. 5A, FIG. 5B and FIG. 5C are the pre-defined conditions followed for bypass evaluation, in accordance with one embodiment.
Figure 5B:
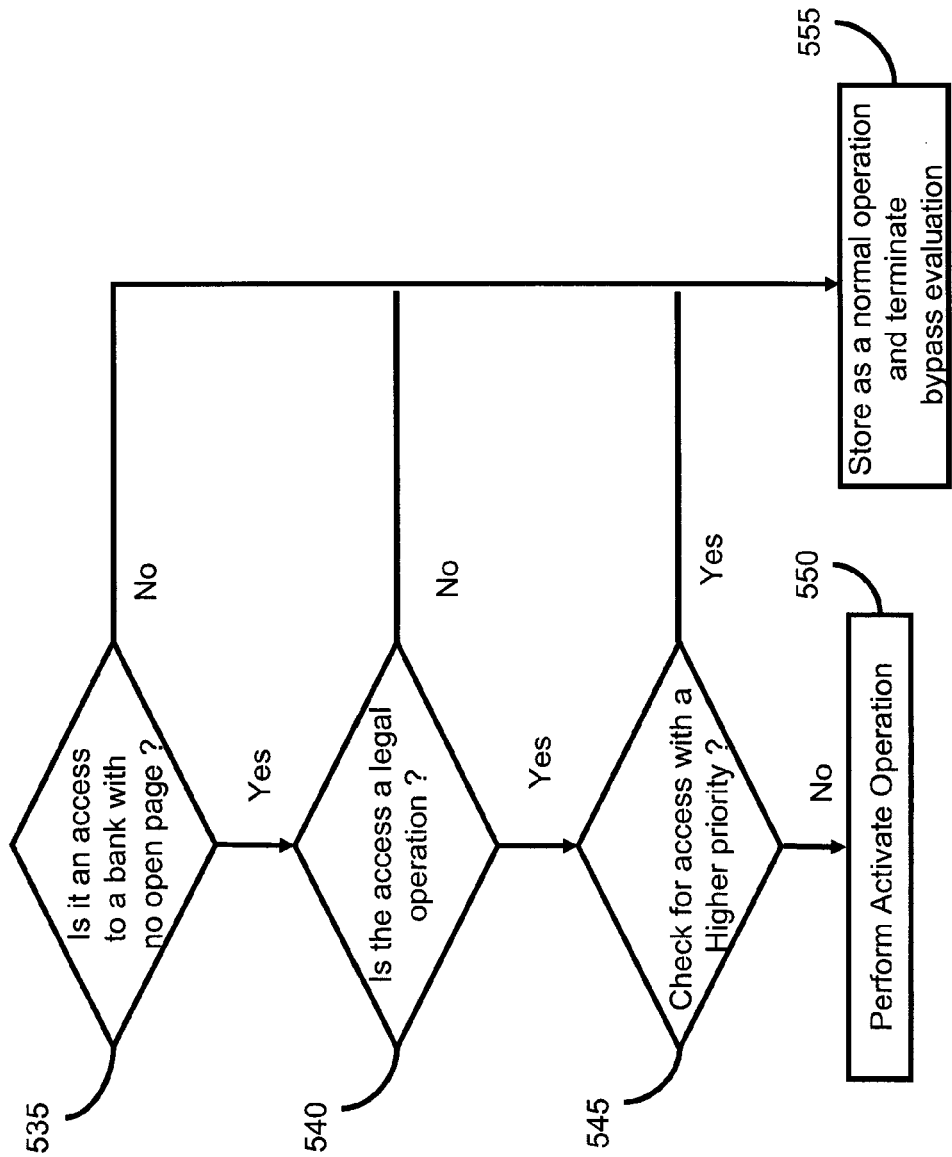
Figure 5C:
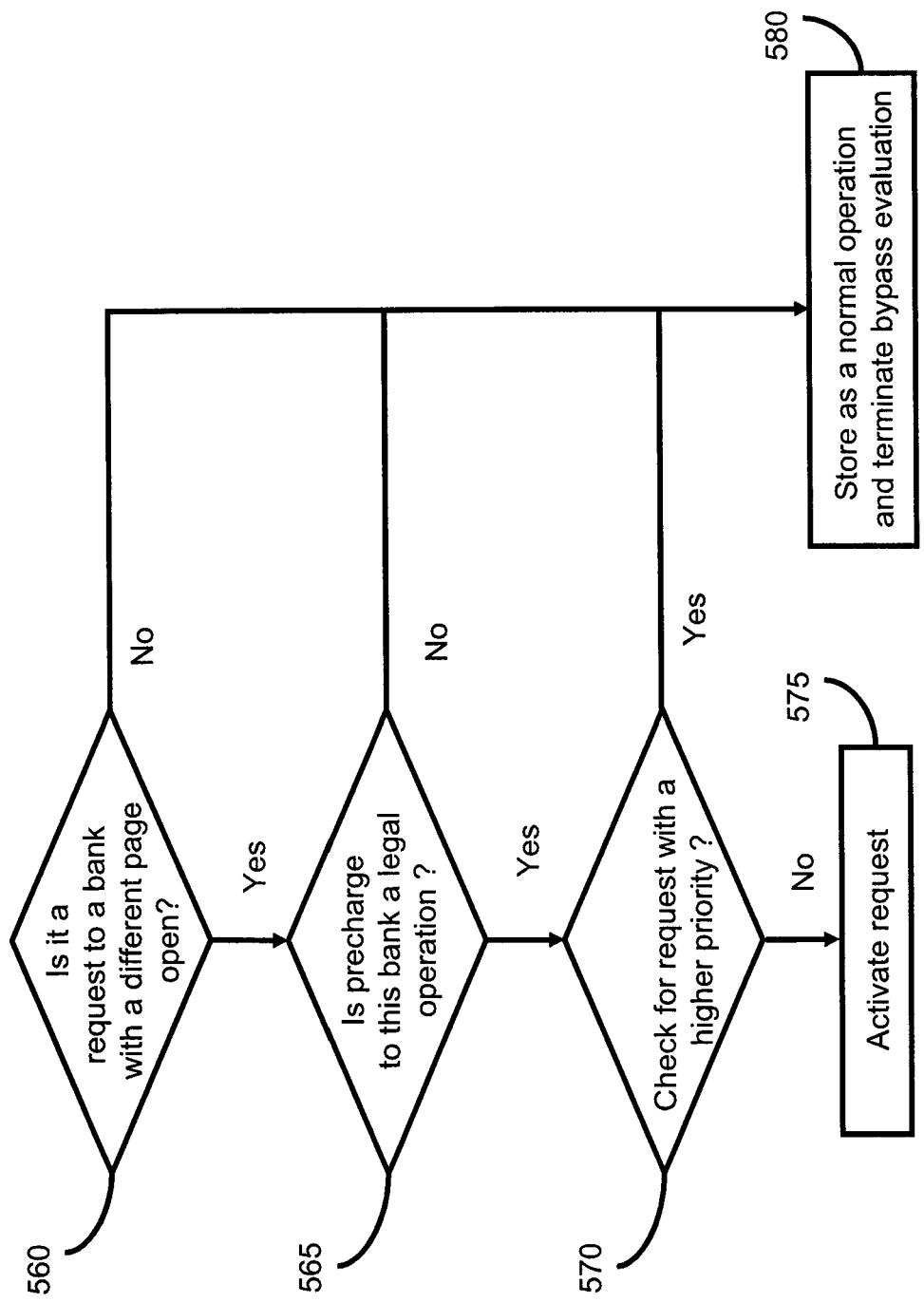

Further, the operations of the decision logic and the bypass operations and the pre-defined conditions are explained in detail in conjunction with FIG. 5A, FIG. 5B and FIG. 5C.

At step 325, the plurality of access requests are issued to the one or more DRAM devices, based on the results of the pre-defined conditions and the bypass operations.

In some embodiments, the operation of the Content Addressable Memory-based Decision Control Module for Bypass Operations includes implementation of a Bypass operation which helps to improve latency in a Memory Controller by allowing recently received operations to be immediately sent to the DRAM, bypassing the normal flow of the command into the CAM Access Storage module. This reduces the cycles needed to execute these operations.

Figure 4:
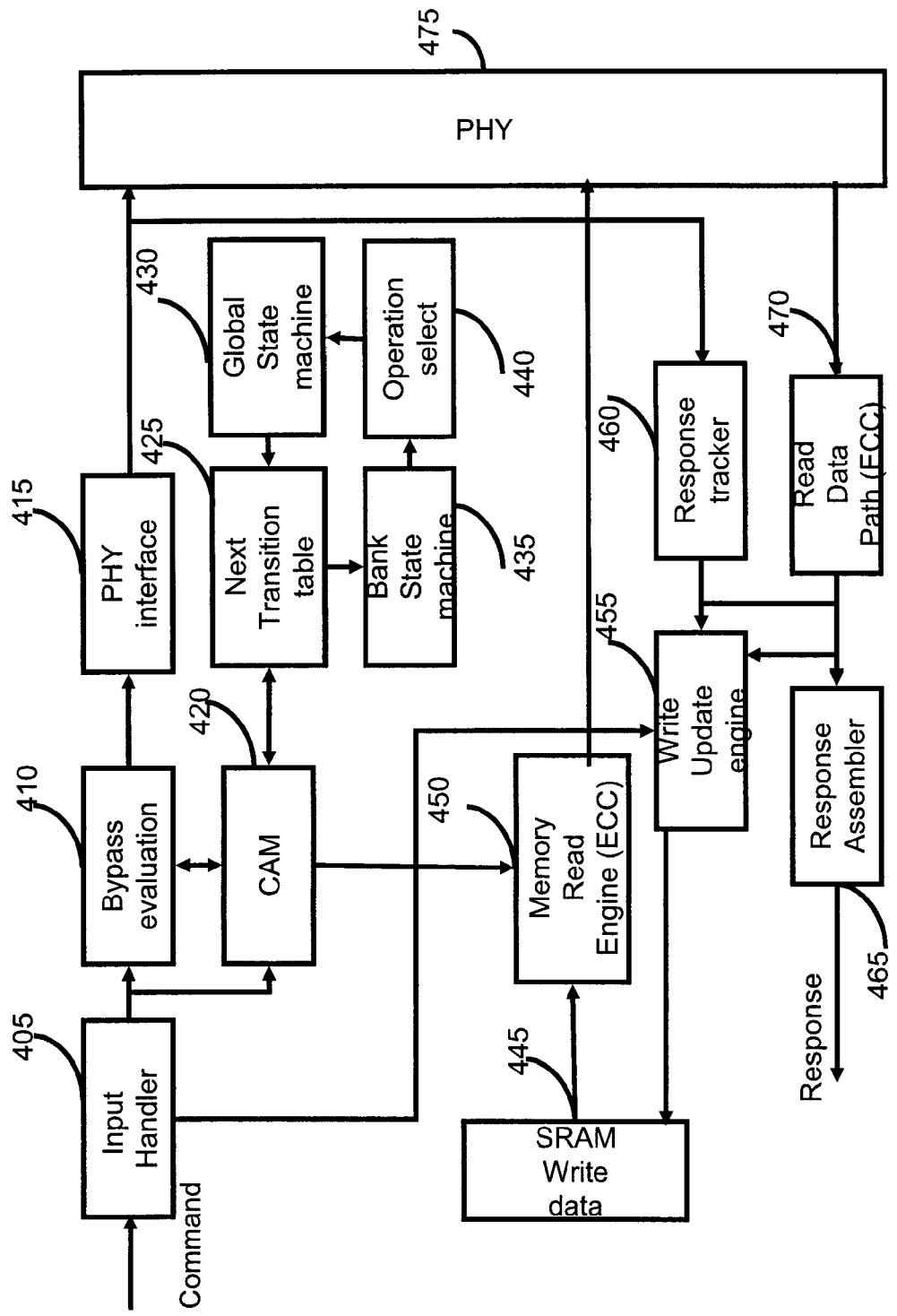
FIG. 4 is a block diagram of a system for reducing latency in a Dynamic Random Access Memory (DRAM) controller, in accordance with an embodiment of the invention.

FIG. 4 is a block diagram of a system for reducing latency in a Dynamic Random Access Memory (DRAM) controller, in accordance with an embodiment of the invention. The DRAM controller includes an input handler 405 in communication with a bypass evaluation 410, and a CAM 420. A PHY interface 415, is in communication with the bypass evaluation 410 and a PHY 475. The CAM 420 is in communication with a next transition table 425 and a memory read engine 450. The next transition table 425 is in communication with a bank state machine 435 and the bank state machine 435 is in communication with an operation select 440. The operation select 440 is in communication with a global state machine 430. The global state machine 430 is in communication with the next transition table 425. A SRAM write data 445 is in communication with the memory read engine (EEC) 450, and a write update engine 455. A response tracker 460 is in communication with the PHY interface 415 and a response assembler 465. The response assembler 465 is in communication with a read data path 470, and the PHY 475.

The input handler 405 receives commands from plurality of user interfaces. The commands are flopped to isolate timing paths outside the DRAM controller. The bypass evaluation checks if a high priority read access request is present and serves the high priority read access request immediately sent to the PHY interface 415. Further, the DRAM controller checks for collision by searching the CAM's to identify if there is a conflict to access same memory address. Further, if this is a read request, then the controller checks if there is another read to the same address in the CAM 420, and proceeds normally and no special handling is performed. If there is a write to the same address in the CAM 420, the read is stalled until the write is scheduled to DRAM and prioritize the scheduling of that write. Furthermore, if this is a write request then a check is performed to determine if there is another write to the same address in the CAM 420, and then proceed by combining the writes by merging the data and maintaining only the first write entry in the CAM 420. Further, if there is a read to the same address in the CAM 420, the write is stalled until the read is scheduled to DRAM and prioritize the scheduling of that read. The CAM 420 enquires if there is no collision and this is not a bypass read, then the read or write request to the CAM 420 is added. If it's a write, then the associated data from the ASIC core logic is requested. The "next transaction" table 425 is essentially a cache of the CAM 420 contents organized as direct-mapped entries per bank and keeps the most optimal next request to be scheduled for each bank from among all of the CAM entries. To maintain this, each new transaction is compared against the existing transaction for that bank in the next transaction table to determine if the new request should replace it. This happens when the new request is a page hit and the old one is not, or when the new request is higher priority than the old one. A representation of the transaction is present in the next transaction table 425. Transactions are scheduled from here as follows:
1. The next transaction table outputs indicators for each bank to the bank state machines. These qualify the requests from the table and pass along per-bank read requests, write requests, activate requests, precharge requests.
2. The "operation selection" looks at all activate requests and determines which bank would be the best to service for an activate request. It makes similar decisions for all read/write requests, for all precharge requests, etc.
3. The "global scheduler" looks at all of the request types: activate, precharge, refresh, read/write, etc. and selects the optimal legal choice. It uses the outputs from operation selection to select the appropriate bank for this request type.
4. The request is sent to PHY interface (PI) 415.
5. The bank and request type are also sent to the next table to retrieve the CAM entry number
6. From the CAM entry number, the entry is looked up in the CAM 420 to get the address for the request.
7. The address is sent to PI 415.

Further, the commands are issued to the PI 415 and replaced. The PI 415 flops all commands and addresses from the schedule and the bypass module and forwards the commands to the PHY 475. Furthermore, after a read or a write, the associated entry is removed from the next transaction table 425 and from the CAM 420. A CAM search is performed to identify a replacement that entry in the next transaction table 425.

FIG. 5A, FIG. 5B and FIG. 5C are the algorithms followed for bypass evaluation, in accordance with one embodiment.

The aforementioned details in the step 325 of FIG. 3 are explained in detail in conjunction with FIG. 5A, FIG. 5B and FIG. 5C.

At step 325, the access requests are bypassed wherein the plurality of access requests are pre-defined conditions for reducing the latency introduced in the DRAM controller.

Further, the implementation of the Bypass operation requires some additional logic to be added to Decision Logic module. This logic, called bypass Evaluation block, is responsible for the determination of the ability of the incoming Read Command request to be immediately processed. Examples, of the command requests include, but are not limited to, the plurality of access requests. Further, the plurality of access requests includes three types of requests that can use the bypass Operation: a Read request, an Activate Request and a Close Page or Precharge Request.

FIG. 5A, FIG. 5B and FIG. 5C are the pre-defined conditions followed for bypass evaluation, in accordance with one embodiment.

FIG. 5A is an algorithm used by the bypass evaluation bock for a read request.

At step 505 a check to evaluate if the read request is a page hit is performed. If it is a page hit step 510 is performed else step 530 is performed wherein at the step 530 the request is stored as a normal operation in the CAM access storage module and the bypass operation is terminated.

At the step 510, a check for legal operation is performed. For example, a read is considered illegal if a write operation is in progress. Further the read may be illegal at any given time, wherein the DRAM device decides the read to be illegal based on a complex set of timing requirements. Further the read operation can be legal if the read operation can be issued without violating any of the timing requirements. If result at the step 510 then step 515 is performed, else step 530 is performed.

At the step 515, a check for any higher priority operation with a page hit is performed. If there exists a higher priority than the current request the step 530 is performed else step 520 is performed.

At the step 520, a check for collision, wherein collision refers to a write operation to same address where the read operation is been requested is performed. If there is a collision then step 530 is performed else step 525.

At the step 525, the read operation is performed. Further the steps 510, 515, and 520 may be performed in any order or in parallel.

FIG. 5B is an algorithm used by the bypass evaluation bock for an activate request.

At step 535, a check to evaluate if an access to a bank in a DRAM memory with no open page is performed. If it has no open page then step 540 is performed else step 555 is performed wherein at the step 555 the request is stored as a normal operation in the CAM access storage module and the bypass operation is terminated.

At the step 540, a check for legal operation is performed. If the step 540 the step 545 is performed else step 555 is performed.

At the step 545, a check for any higher priority operation in the CAM to the bank is performed. If there exists a higher priority than the current request it proceeds to the step 555 or else to step 550 is performed.

At the step 550, the request is been activated. Further the steps 535, 540, and 545 may be performed in any order or in parallel.

FIG. 5C is an algorithm used by the bypass evaluation bock for a close page request is performed.

At step 560 a check to evaluate if an access to a bank in a DRAM memory with an open page is performed and the open page is a page other than the one required for the access. If it has the such an open page step 565 is performed else step 580 is performed, wherein at the step 580 the request is stored as a normal operation in the CAM access storage module and the bypass operation is terminated.

At the step 565, a check for legal operation is performed. If the step 565 is legal then step 570 is performed else step 580 is performed.

At the step 570, a check for any higher priority operation in the CAM to the bank is performed. If there exist a higher priority than the current request it proceeds to the step 580, else step 575 is performed.

At the step 575, the request is been activated, wherein the request can be precharge request. Further the steps 560, 565, and 570 may be performed in any order or in parallel.

In one embodiment to determine at least one paramount access request from a plurality of access request CAM based decision controller invokes a host of considerations. Examples of the host of considerations includes but not limited to Read command, Write command, Read-modify-write command, Explicit activate command, Explicit precharge command and Refresh command.

The explicit additional activate or precharge commands is a logical extension for request cases whereby a user can reduce latency of subsequent commands by requesting specific state change either from an activate to precharge or from precharge to activate state to a DRAM array.

The foregoing description sets forth numerous specific details to convey a thorough understanding of embodiments of the invention. However, it will be apparent to one skilled in the art that embodiments of the invention may be practiced without these specific details. Some well-known features are not described in detail in order to avoid obscuring the invention. Other variations and embodiments are possible in light of above teachings, and it is thus intended that the scope of invention not be limited by this Detailed Description, but only by the following Claims.

What is claimed is:

1. A memory controller comprising:
  a content-addressable memory (CAM)-based Decision Control Module comprising:
    a content-addressable memory (CAM) Access Storage Module storing a plurality of access requests;
    a Next Access Table Module for storing the plurality of access requests; and
    a decision logic module configured to:
      compare a newly-received access request to a highest-priority stored access request, wherein the highest-priority stored access request is stored in the CAM Access Storage Module; and
      determine that the newly-received access request should bypass the highest-priority stored access request;
      update the Next Access Table Module to include the newly-received access request; and
  a memory-access control interface configured to:
    issue the newly-received access request from the Next Access Table Module to a memory device, wherein the newly-received access request is issued ahead of the highest-priority stored access request.

2. The memory controller of claim 1, wherein the CAM-based decision control module further comprises bypass evaluation logic to make the determination that the newly-received access request should bypass the highest-priority stored access request.

3. The memory controller of claim 2, wherein the bypass evaluation logic is configured to determine that the newly-received access request is a read request, an activate request, or a precharge request.

4. The memory controller of claim 3, wherein the bypass evaluation logic is configured to determine that the newly-received access request is a page hit.

5. The memory controller of claim 4, wherein the bypass evaluation logic is configured to determine that the newly-received access request is a legal request.

6. The memory controller of claim 5, wherein the CAM-based decision control module is further configured to determine that the newly-received access request is legal based on a set of timing requirements.

7. The memory controller of claim 3, wherein the bypass evaluation logic is configured to determine that the newly-received access request has a higher priority than the highest-priority stored access request.

8. The memory controller of claim 3, wherein the newly-received access request is determined to be a read or write request, and wherein the CAM-based decision control module is further configured to determine that there is no conflict between newly-received access request and any access request currently stored in the CAM Access Storage Module.

9. One or more computer-readable non-transitory storage media embodying software operable when executed to:
  store, in a content-addressable memory (CAM) Access Storage Module, a plurality of access requests;
  compare a newly-received access request to a highest-priority stored access request, wherein the highest-priority stored access request is stored in the CAM Access Storage Module;
  determine that the newly-received access request should bypass the highest-priority stored access request;
  update a Next Access Table Module to include the newly-received access request; and
  issue the newly-received access request from the Next Access Table Module to a memory device, wherein the newly-received access request is issued ahead of the highest-priority stored access request.

10. The media of claim 9, wherein the CAM-based decision control module further comprises bypass evaluation logic to make the determination that the newly-received access request should bypass the highest-priority stored access request.

11. The media of claim 10, wherein the bypass evaluation logic is configured to determine that the newly-received access request is a read request, an activate request, or a precharge request.

12. The media of claim 11, wherein the bypass evaluation logic is configured to determine that the newly-received access request is a page hit.

13. The media of claim 12, wherein the bypass evaluation logic is configured to determine that the newly-received access request is a legal request.

14. The media of claim 13, wherein the CAM-based decision control module is further configured to determine that the newly-received access request is legal based on a set of timing requirements.

15. The media of claim 11, wherein the bypass evaluation logic is configured to determine that the newly-received access request has a higher priority than the highest-priority stored access request.

16. The media of claim 11, wherein the newly-received access request is determined to be a read or write request, and wherein the CAM-based decision control module is further configured to determine that there is no conflict between newly-received access request and any access request currently stored in the CAM Access Storage Module.

17. A method comprising:
- storing, in a content-addressable memory (CAM) Access Storage Module, a plurality of access requests;
- compare a newly-received access request to a highest-priority stored access request, wherein the highest-priority stored access request is stored in the CAM Access Storage Module;
- determining, using bypass evaluation logic, that the newly-received access request should bypass the highest-priority stored access request;
- updating a Next Access Table Module to include the newly-received access request; and
- issuing the newly-received access request from the Next Access Table Module to a memory-access control interface, wherein the newly-received access request is issued ahead of the highest-priority stored access request.

18. The method of claim 17, wherein the bypass evaluation logic is configured to determine that the newly-received access request is a page hit and that the newly-received access request is a legal request.

19. The method of claim 17, wherein the bypass evaluation logic is configured to determine that the newly-received access request should bypass the highest-priority stored access request based on ages of the access requests stored in the CAM Access Storage, an order of the stored access requests, a number of accesses to a particular memory device, and a priority of the newly-received access request.

20. The method of claim 17, wherein the newly-received access request is determined to be a read or write request, and wherein the bypass evaluation logic determines that there is no conflict between newly-received access request and any access request currently stored in the CAM Access Storage Module.

\* \* \* \* \*